(12) United States Patent
Singh et al.

(10) Patent No.: US 7,107,477 B1
(45) Date of Patent: Sep. 12, 2006

(54) PROGRAMMABLE LOGIC DEVICES WITH SKEWED CLOCKING SIGNALS

(75) Inventors: Deshanand Singh, Mississauga (CA); Andrew Hall, High Wycombe (GB)

(73) Assignee: Altera Corporation, San Jose, CA (US)

( * ) Notice: Subject to any disclaimer, the term of this patent is extended or adjusted under 35 U.S.C. 154(b) by 597 days.

(21) Appl. No.: 10/357,040

(22) Filed: Jan. 31, 2003

(51) Int. Cl.
*G03F 7/38* (2006.01)

(52) U.S. Cl. ............ 713/503; 713/400; 713/401; 713/500; 713/501; 713/502; 713/600; 713/602

(58) Field of Classification Search ........ 713/400–401, 713/500–503, 600–601
See application file for complete search history.

(56) References Cited

U.S. PATENT DOCUMENTS

| | | | |
|---|---|---|---|
| 5,550,782 A | 8/1996 | Cliff et al. | |
| 5,689,195 A | 11/1997 | Cliff et al. | |
| 6,107,826 A * | 8/2000 | Young et al. | 326/41 |
| 6,215,326 B1 | 4/2001 | Jefferson et al. | |
| 6,292,016 B1 * | 9/2001 | Jefferson et al. | 326/39 |
| 6,323,679 B1 * | 11/2001 | Robertson et al. | 326/39 |
| 6,487,648 B1 * | 11/2002 | Hassoun | 711/167 |
| 6,538,489 B1 * | 3/2003 | Nakano | 327/297 |
| 6,690,224 B1 * | 2/2004 | Moore | 327/296 |
| 6,816,979 B1 * | 11/2004 | Chen et al. | 713/400 |
| 6,862,548 B1 * | 3/2005 | Chan | 702/125 |
| 6,873,187 B1 * | 3/2005 | Andrews et al. | 326/93 |

OTHER PUBLICATIONS

V. Betz, J. Rose, and A. Marquardt, *Architecture and CAD for Deep-Submicron FPGAs*, Kluwer Academic Publishers, 1999, Chapter 3, pp. 37-61.
J. Cong and Y. Ding, FlowMap: An optimal technology mapping algorithm for delay optimization in lookup-table based FPGA designs, *IEEE Transactions on CAD*, Jan. 1994, pp. 1-12.
John P. Fishburn, Clock Skew Optimization, *IEEE Trans. Computer*, Jul. 1990, vol. 39, No. 8, pp. 945-951.
C. Leiserson, F. Rose, and J. Saxe, Optimizing synchronous circuitry, *Journal of VLSI and Computer Systems*, 1983, pp. 41-67.
C. Leiserson and J. Saxe, Retiming synchronous circuitry, *Algorithimca*, vol. 6(1), pp. 5-35, 1991.
D. Singh and S. Brown, The Case for Registered Routing Switches in FPGAs, FPGA 2001.
Xilinx, Inc., 2100 Logic Drive, San Jose, CA 95124, A Look at "Minimum" Delays, http://support.xilinx.com/xcell/xl21/xl21-40.pdf.
Singh et al., Constrained Clock Shifting for Field Programmable Gate Arrays, FPGA '02, Feb. 24-26, 2002, Monterey, California, USA.

* cited by examiner

*Primary Examiner*—A. Elamin
(74) *Attorney, Agent, or Firm*—Fish & Neave IP Group of Ropes & Gray, LLP; Robert R. Jackson

(57) ABSTRACT

A programmable logic device has programmable phase-shifting circuitry. The phase-shifting circuitry is used to generate a set of skewed clock signals that is used to adjust the relative timing of device elements in a circuit synthesized in the programmable logic device. By suitably adjusting the relative timing of the device elements, the circuit critical path lengths are effectively reduced leading to improved circuit frequency performance. Algorithms are provided for establishing clock skew values that lead to improved circuit performance. The algorithms are incorporated in computer aided design tools to enable automatic optimization of circuit designs.

36 Claims, 10 Drawing Sheets

PROGRAMMABLE LOGIC DEVICES WITH SKEWED CLOCKING SIGNALS

BACKGROUND OF THE INVENTION

Programmable logic devices (PLDs) (or field programmable gate arrays (FPGAs)), are integrated circuit devices with configurable logic networks linked together by programmable interconnection resources. The configurable logic networks may include device elements such as logic cells (e.g., look-up tables (LUTs) or product term logic), memory cells, and input-output cells. Registers (e.g., D-type flip-flops) may be associated with one or more of the device elements. The registers hold and transfer data signals (i.e., variables) between the device elements during PLD operation.

The number of device elements in modern-day PLDs can be very large. These device elements are often architecturally organized into blocks of programmable logic (e.g., gate array or logic array block ("LAB")), blocks of input-output cells, and blocks of memory (e.g., random access memory ("RAM")), etc. Groups of these blocks may make up larger blocks (e.g., "MEGALABs") that are arranged, for example, in an X-Y array. The programmable interconnection resources of the PLD often are organized as rows and columns of conductors for selectively routing signals to, from, and between the logic, input-output, and memory blocks.

In addition to the programmable interconnection resources for routing data signals, the PLDs include one or more clock networks for distributing "timing" or "clock" signals across the PLD to each individual device element. See, for example, Cliff et al. U.S. Pat. No. 5,550,782, Cliff et al. U.S. Pat. No. 5,689,195, and Jefferson et al. U.S. Pat. No. 6,215,326, all of which show PLD architectures developed by Altera Corporation of San Jose, Calif.; but other examples of architectures with which the present invention can be used include those developed by other PLD manufacturers such as Xilinx, Inc., also of San Jose, Calif.

Complex logic functions (circuits), as desired, may be implemented in present-day PLDs. The logic functions are implemented by interconnecting a select configuration of device elements according to a suitable circuit design. Conventional circuit design techniques for synthesis of logic functions may be used to generate the suitable circuit design. The circuit design may be characterized by a corresponding configuration file (i.e., a netlist) that specifies the placement of selected device elements and the routing of interconnection between the selected device elements. PLDs usually have a large number of device elements that have identical functionality (e.g., AND gates) and which may be used interchangeably. Therefore, several possible circuit designs (i.e., configurations of device elements) may yield the same desired logic function.

A common measure of circuit performance, data signal propagation delay, may be used to select a particular design for implementation. The data signal propagation delay depends, inter alia, on the length of interconnections and on the number of registers between device elements traversed by data signals. For typical PLDs, most of the data signal propagation delay is due to interconnection delays. Thus, a common figure of merit of PLD circuit delay performance is the length (in units of time) of the longest register-to-register interconnection path ("the critical path"). This critical path also determines the minimum cycle time for a logic step in the PLD circuit. The minimum cycle time is inversely related to the maximum operating frequency of the PLD circuit $F_{max}$. In PLD operation a reference or master clock signal timing various device elements in the PLD is set to have a period or cycle, which is greater than the minimum cycle time.

Automated computer-aided design (CAD) algorithms may be used to implement (place and route) a synthesized circuit design. The CAD algorithms may use conventional physical models to estimate delays along individual interconnection conductors and through individual device elements. However, the optimization of PLD circuit designs with a large number of device elements and interconnections, is a non-trivial task. Estimation of the signal propagation delays across a PLD circuit network may require time-consuming or otherwise expensive computations, and usually can be obtained only after the actual placement and routing of the PLD circuit design is accomplished. If the design does not meet suitable operating frequency design criteria, often alternative designs have to be generated by empirically adding placement constraints and/or re synthesizing the desired logic function in an attempt to find a circuit design with a smaller critical path length.

For digital circuits in general, additional optimization techniques may be used to further reduce an initially-designed critical path length.

An iterative optimization technique, which is commonly called "retiming," involves repositioning registers along the path of data signals. For example, registers associated with logic cells may be repositioned from the cells' output to input or vice versa, so that the critical path is as short as possible. Repositioning of registers along the data path between the device elements cannot reduce critical path length below the length of the longest interconnection that must be used in a PLD circuit.

Other optimization techniques do not involve repositioning of registers and may be based on temporal considerations. These techniques, which may be used to operate digital circuits at frequencies higher than the designed-for clock frequency, are often referred to as "clock shifting" techniques. Clock shifting involves synchronizing sequential device elements (e.g., registers) that are located at the ends of a data path to operate at different times. Skewed (i.e., phase-shifted) clock signals may be used to sequentially time the device elements. See, for example, John P. Fishburn, "Clock Skew Optimization," IEEE Trans. Computer, Vol. 39, No. 8, pp. 945–951, July 1990. Clock shifting mitigates the operating frequency-reducing effect of the data signal delay along a long data path by advancing the operation of the data-sending device element and by postponing the operation of the data-receiving device element. The data signal is effectively given more time to propagate on the long data path than on shorter data paths. The resulting operating frequency improvement is limited by the device element timing differences (or amount of clock skew), which can be inserted or introduced without disturbing circuit function. For example, the operation of the data-receiving device element may not be postponed for so long that the input signal data has disappeared. The tolerable amount of inserted clock skew depends on the data signal propagation delay between the device elements, and the delays in the clock signal from the clock source to the device elements, and device parameters such as setup time and hold time, which describe the operating times that are required for proper device functioning (e.g., to register data).

Consideration is now being given to enhancing programming logic device architectures to make them suitable for the application of clock shifting techniques, and to ways of applying clock shifting techniques to improve PLD circuit performance.

SUMMARY OF THE INVENTION

In accordance with the present invention, programmable logic device architectures are enhanced by providing programmable phase-shifting circuitry to generate a range of skewed clock signals. Further, methods for determining and using optimal clock signals skews to improve PLD circuit performance are provided In an enhanced PLD architecture, the phase-shifting circuitry includes a phase lock loop frequency synthesizer and a sampling shift register. A set of phase-shifted versions of a nominal clock signal is generated by sampling or shifting the nominal clock signal through the shift register at frequencies, which are higher than the nominal clock signal frequency. The set of phase-shifted clock signals can be used to adjust the relative timing of PLD circuit device elements to improve circuit frequency performance.

The circuit performance improvement methods involve adjusting the relative timing or clocking of synchronous logic device elements to effectively reduce the circuit critical path length. Algorithms are provided for computing a discrete set of optimal device-clocking delay times for a specified PLD circuit netlist. In a skewed-clock mode of circuit operation, phase-shifted clock signals corresponding to the computed set of delay times are generated. The phase-shifted clock signals may be generated, for example, by programming the specifically provided phase-shifting circuitry. The generated phase-shifted clock signals are propagated over the programmable logic device clock distribution network and used to sequentially clock appropriate circuit device elements along the data path at different times. Clocking device elements at different times allows data signals relatively more time to propagate on a critical path than on a less critical path. This effectively reduces the critical path length and improves the operating frequency characteristics of the circuit design.

The inventive algorithms that are used to compute the set of performance-improving clock shifts or skews are based on integer programming techniques. The algorithms use a lumped parameter model to characterize variability in circuit component characteristics. The algorithms include a test algorithm to determine the feasibility of introducing performance-improving clock shifts in a circuit design without risking circuit functionality. The algorithms may also include a search procedure for finding an optimal set of clock shift values for maximizing the operating frequency of the circuit. The search procedure is based on integer programming techniques. The search procedure takes into account logic device setup time and hold time requirements for properly registering data signals to limit the range of clock shift values searched.

The algorithms are provided on computer-readable media. The algorithms can be integrated with conventional computer-aided design tools to automatically apply clock-shifting optimization to circuit designs generated by the design tools.

Further features of the invention, its nature and various advantages will be more apparent from the accompanying drawings and the following detailed description.

DETAILED DESCRIPTION

Figure 1A:
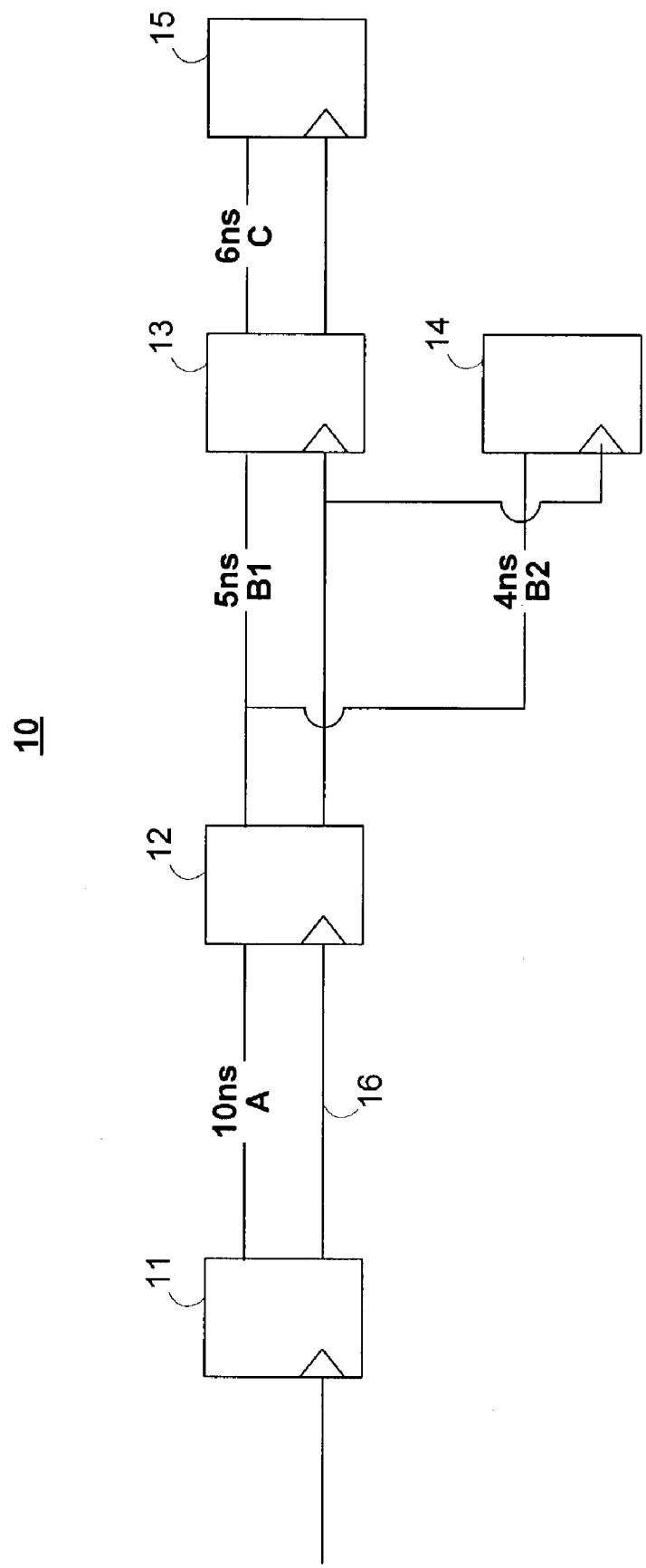
FIG. 1a is a diagram of an illustrative sequentially logic circuit.
Figure 1B:
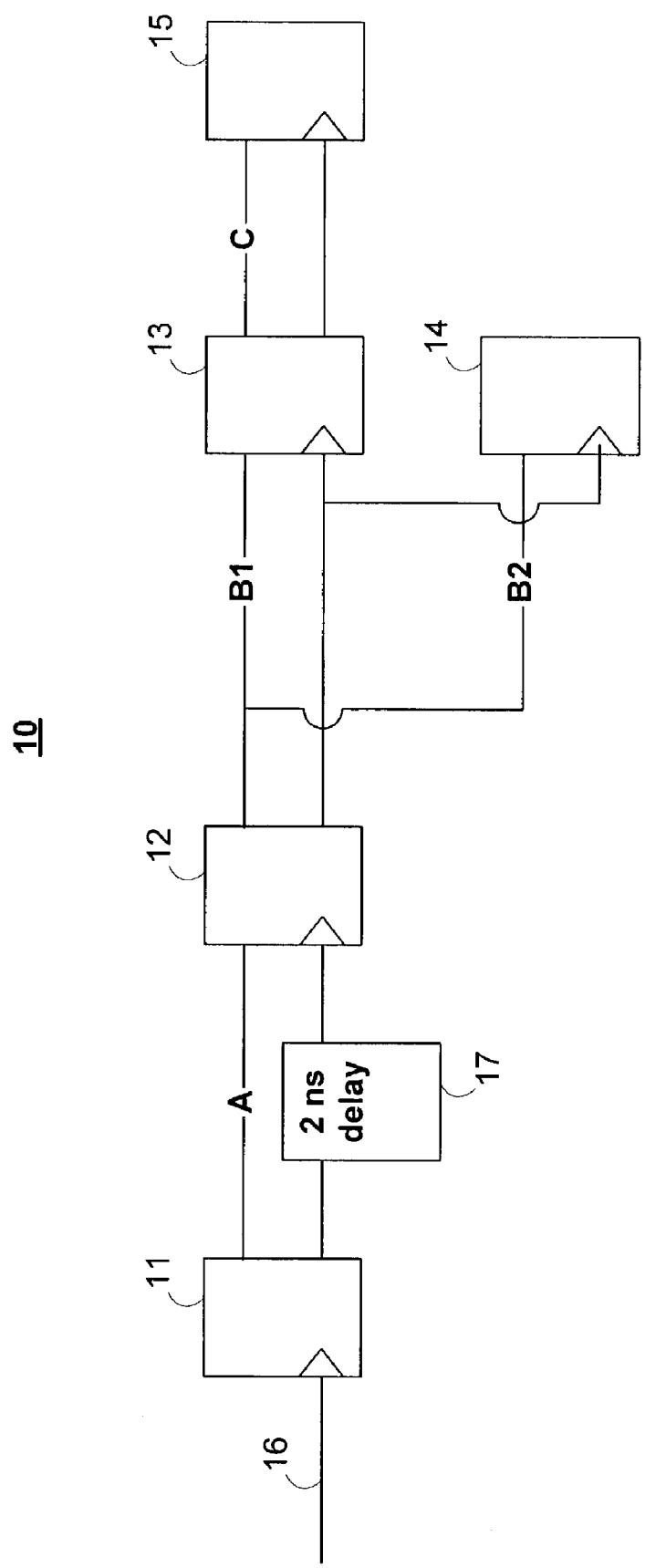
FIG. 1b is a diagram showing the circuit of FIG. 1a, which has been modified to accommodate skewed clock signals.

The concept of clock skew insertion in PLD circuits to improve circuit frequency performance may be understood by reference to an illustrative circuit 10 portion shown in FIGS. 1a and 1b. Circuit 10 portion includes a chain of interconnected registers. FIG. 1a shows, for example, interconnected registers 11, 12, 13, 14 and 15, which are clocked by a clock signal propagating on clock line 16. Data signals are transmitted from register 11 to register 12 over data path A, from registers 12 to registers 13 and 14 over data paths B1 and B2, respectively, and from register 13 to register 15 over data path C. The path lengths (delays) A, B1, B2, and C, may, for example, be about 10 ns, 5 ns, 4 ns, and 6 ns, respectively. Circuit 10 has a maximum operating frequency Fmax (which is inversely related to the longest data path, A=10 ns) of about 100 MHz. FIG. 1b shows modified circuit 10 in which delay circuit 17 inserts a 2 ns delay in the clock signal to register 12 clock input. This inserted delay allows 2 ns more for a data signal from register 11 to be transmitted over path A to register 12. The inserted delay also slows the propagation of the data signal from register 12 to registers 13 and 14 by 2 ns (by making the register 12 data available 2 ns later). This slowing of register 12 data propagates through all follow-on data paths downstream from register 12. Therefore, the effective path lengths B1, B2 and C in modified circuit 10 are increased by the inserted delay of 2 ns to about 7 ns, 6 ns, and 8 ns. Shifting circuit 10 critical path length of 10 ns (path A) to a lower effective length of 8 ns permits higher frequency circuit operation. Modified circuit 10 may be operated at frequencies of about 125 MHz (1/(8 ns)), which is a distinct improvement over unmodified circuit 10 Fmax (100 MHz).

The inventive methods use clock-shifting techniques to improve the frequency performance of PLD circuits. First, a set of suitable delay times for the relative timing or clocking of circuit device elements, which reduces circuit critical path lengths, is computed or otherwise estimated. The delay times may be positive or negative. The size of the set (i.e., the number of delay times in the set) may depend on the PLD architecture specifics. The set may, for example, include a local delay time for each circuit device element, or may, for example, include just a few global or regional delay times. The global or regional delay times may be applied to appropriate individual device elements or groups of device elements in the circuit. The number of delay times in a useful set may be empirically determined by considering the sensitivity (or insensitivity) of the expected performance improvement to number of distinct skewed clock signals used in the optimization procedure. The number of delay times in a useful set also may be limited by practical considerations such as the number of clock lines that are built into the PLD clock distribution networks, and are available to distribute skewed clock signals.

In the skewed-clock mode of PLD circuit operation, the computed or estimated set of delay times, are inserted in the circuit's nominal clock signals, which are then delivered to appropriate device elements. In some PLD circuits, the set of delay times may be inserted in device-element specific clock signals by programmably routing the nominal (un-skewed) clock signals through unused device elements and interconnections. (The unused device elements and interconnections are those that are not used in the circuit netlist). Alternatively, the PLDs may be provided with phase-shifting circuitry, and such circuitry may be used to generate phase-shifted clock signals, which are phase-shifted or skewed by the desired delay times.

Figure 2A:
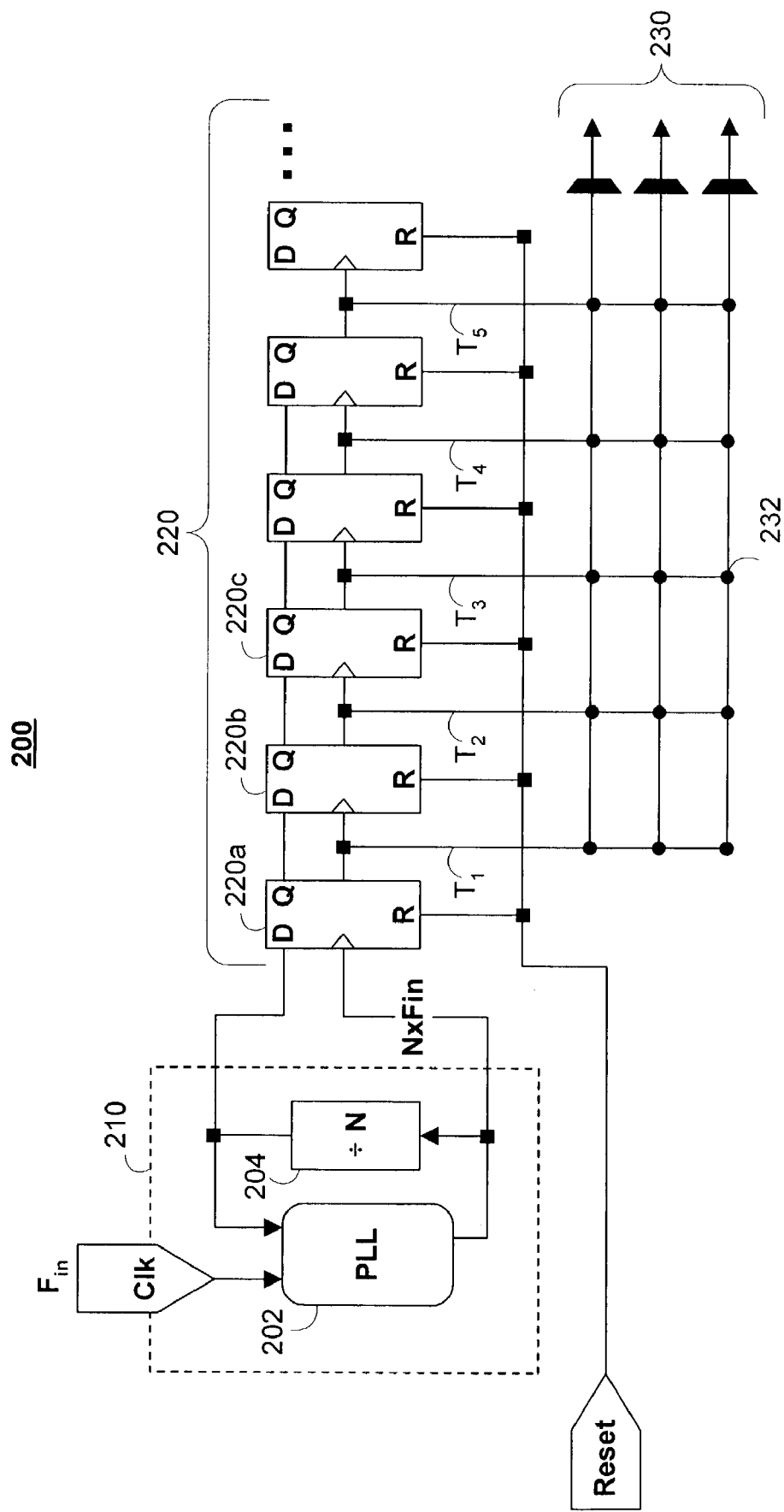
FIG. 2a is a schematic diagram of phase-shifting circuitry incorporated in a programmable logic device architecture, which may be used to generate phase-shifted clock signals, in accordance with the present invention.

FIG. 2a shows, for example, a programmable phase shift circuit 200, which may be used to generate phase-shifted or skewed clock signals. Circuit 200 may be built into PLD architectures to permit clock-shifting optimization of circuit performance. Circuit 200 includes a frequency multiplier 210, a programmable shift register 220, and multiplexer 230. Multiplexer circuitry 230 output may be connected to the PLD clock distribution networks.

Frequency multiplier 210 may be a conventional frequency synthesizer circuit designed to multiply the frequency Fin of input clock signal Clk. Frequency multiplier 210 may, for example, include a phase lock loop (PLL) block 202 operating in parallel with a divide-by-N counter 204. The number N may, for example, be a programmable variable integer. PLL block 202 may include conventional phase comparators, varactors, and voltage or current-driven oscillators or other suitable circuitry (not shown), which are configured to generate an output signal having a frequency NxFin. In operation, counter 204 provides an output feed back signal to PLL block 202 to regulate the PLL output signal frequency NxFin. PLL block 202 output signal may be used to drive shift register 220, and to sample input clock signal Clk. Shift register 220 may be any conventional shift register. For example, shift register 220 may include a conventional cascade of flip-flops (e.g., D flip-flops 220a, 220b, 220c, . . . , etc.).

In circuit 200 operation, clock signal Clk having frequency Fin is fed to the input of first flip-flop (e.g., flip-flop 220a) and shifted along shift register 220 cascade at a frequency NxFin. As a consequence clock signal Clk is delayed or phase-shifted across each flip-flop by a fractional cycle time 1/NxFin.

A PLD circuit asynchronous reset signal Reset may optionally be connected to shift register 220 and used to reset shift register 220 flip-flops. Using the same reset signal to reset both the circuit and shift register 220 ensures that the flip-flops are clocked sequentially in increasing order from left to right (FIG. 2a). Leading or active edges of the phase-shifted clock signals are asserted only after the nominal clock signal's (Clk's) leading or active edge is asserted.

Multiplexer 230 circuitry may be used to sample and obtain one or more phase-shifted versions of clock signal Clk. For example, taps (e.g., T1, T2, T3, . . . etc.), which are connected to the outputs of shift register 220 flip-flops, sample a series of phase-shifted versions of clock signal Clk. The phases of the phase-shifted signals in the sampled series have phases that are shifted from the phase of the nominal clock signal Clk by integer multiples of the fractional cycle 1/NxFin. In circuit 200 operation, multiplexer circuitry 230 may be programmed, for example, by using conventional switches 232, to select a set of desired phase-shifted versions of clock signal Clk. The set of phase-shifted versions of clock signal Clk may be propagated through the PLD circuit using the clock distribution network built into the PLD.

Figure 2B:
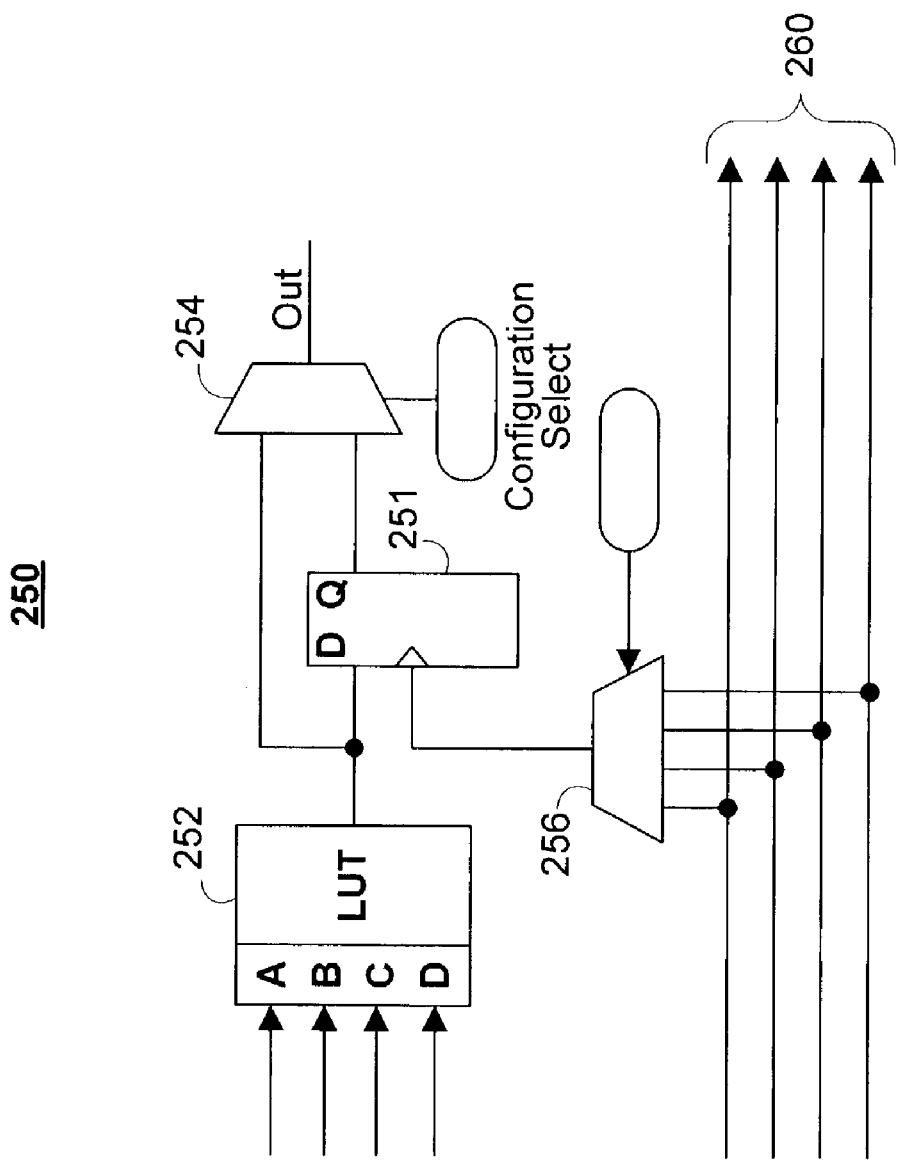
FIG. 2b is a schematic diagram of an exemplary programmable logic device circuit portion, which is served by four clock lines. The four clock lines can propagate skewed clock signals generated, for example, by the phase-shifting circuitry of FIG. 2a, in accordance with the invention.

As previously mentioned, the number of distinct phase-shifted signals in the selected set may correspond to or be limited by the number of available PLD clock lines L. The number L in typical PLDs is often about 4. FIG. 2b shows an exemplary PLD circuit portion 250, which is served by, for example, four clock lines 260. The clock signals propagating over four clock lines 260 may include skewed clock signals, which, for example, are generated by circuit 200 (FIG. 2a). Portion 250 includes a conventional four-input lookup table (LUT) 252 having inputs A, B, C, and D, a flip-flop 251, a configuration-selectable output multiplexer 254, and a programmable clock multiplexer 256. Flip-flop 251 may be timed or clocked by a clock signal propagating over any one of four clock lines 260. The signal chosen to clock flip-flop 251 may be selected by suitably programming multiplexer 256 to connect an appropriate clock line to flip-flop 251 clock input.

Alternative or additional local deployments of phase-shifting circuitry may be provided in a PLD to avoid or bypass limitations on the usable number of phase-shifted clock signals that arise from the limited availability of clock lines in the PLD. Use of local phase-shifting circuitry may enable use of a larger set of distinct phase-shifted signals for clock-shifting optimization. Use of a larger set of distinct phase-shifted signals may decrease the granularity (differences) of the discrete phase-shift values used, and thereby provide a finer degree of control over circuit performance. Additionally, local phase-shifting circuitry may allow multiple clock domains to co-exist undisturbed in the PLD circuit design.

Figure 3A:
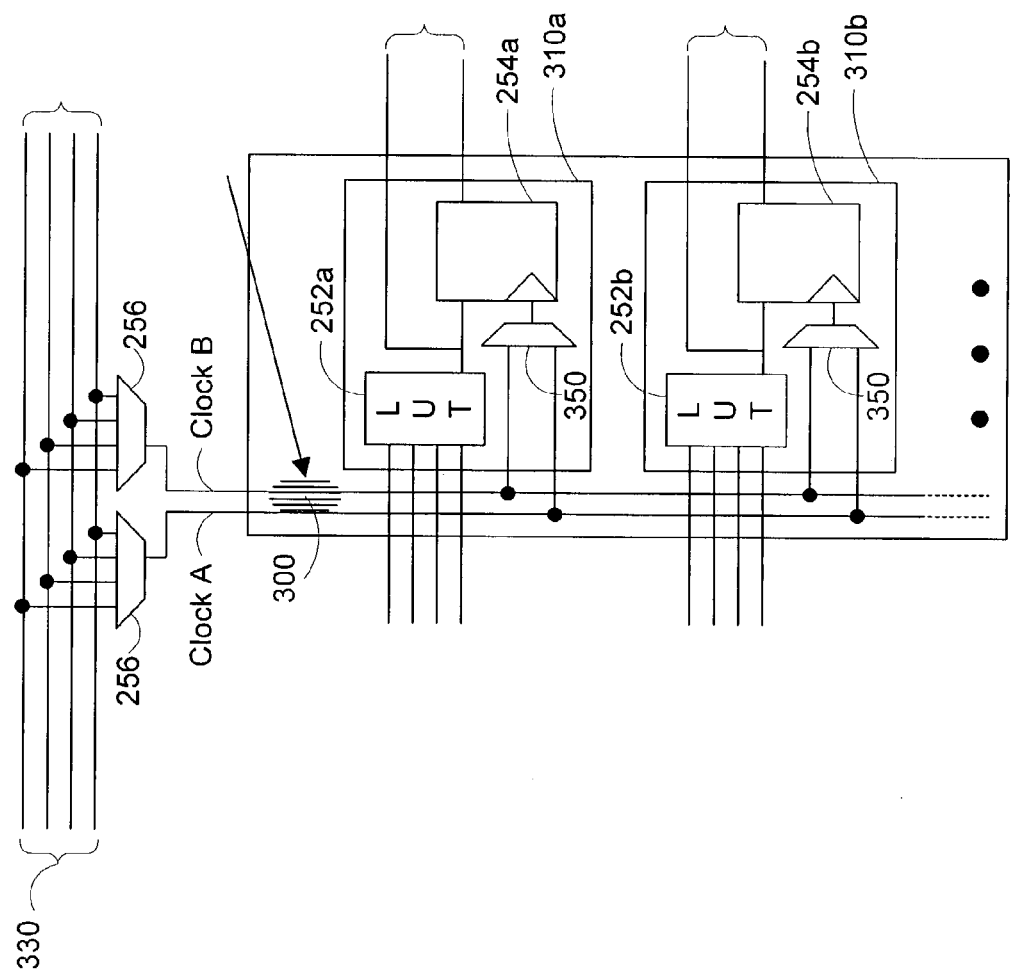
FIG. 3a illustrates local delay circuitry deployed at the boundary of a logic array block, in accordance with the invention.

The local phase-shifting circuitry, may, for example, be placed or disposed at a location close to individual device elements or groups of device elements. FIG. 3a shows, for example, deployment of local delay circuitry 300 at the boundary of a logic array blocks (LABs) 310a and 310b, proximate to the device elements in the LABs. Illustrative LABs 310a and 310b shown in FIG. 3a, may, for example, include LUTs 252a and 252b, respectively. The outputs of LUTS 252a and 252b lead to flip-flops 254a and 254b, respectively. The clocking signals for these flip-flops are derived by multiplexing clock signal A and clock signal B using multiplexers 350.

Clock signals A and B themselves may be obtained by using multiplexers 256 to multiplex clock signals propagating on PLD clock network lines 330. Local delay circuitry 300 may be optionally disposed in the paths of clock signal A and/or clock signal B leading to LABs 310a and 310b from the network lines 330. FIG. 3a shows, for example, local delay circuitry 300 disposed in the path of clock signal B to introduce delays in clock signal B. Delayed clock signal B may be used time down stream devices (e.g., flip-flops 252a and/or 252b).

Figure 3B:
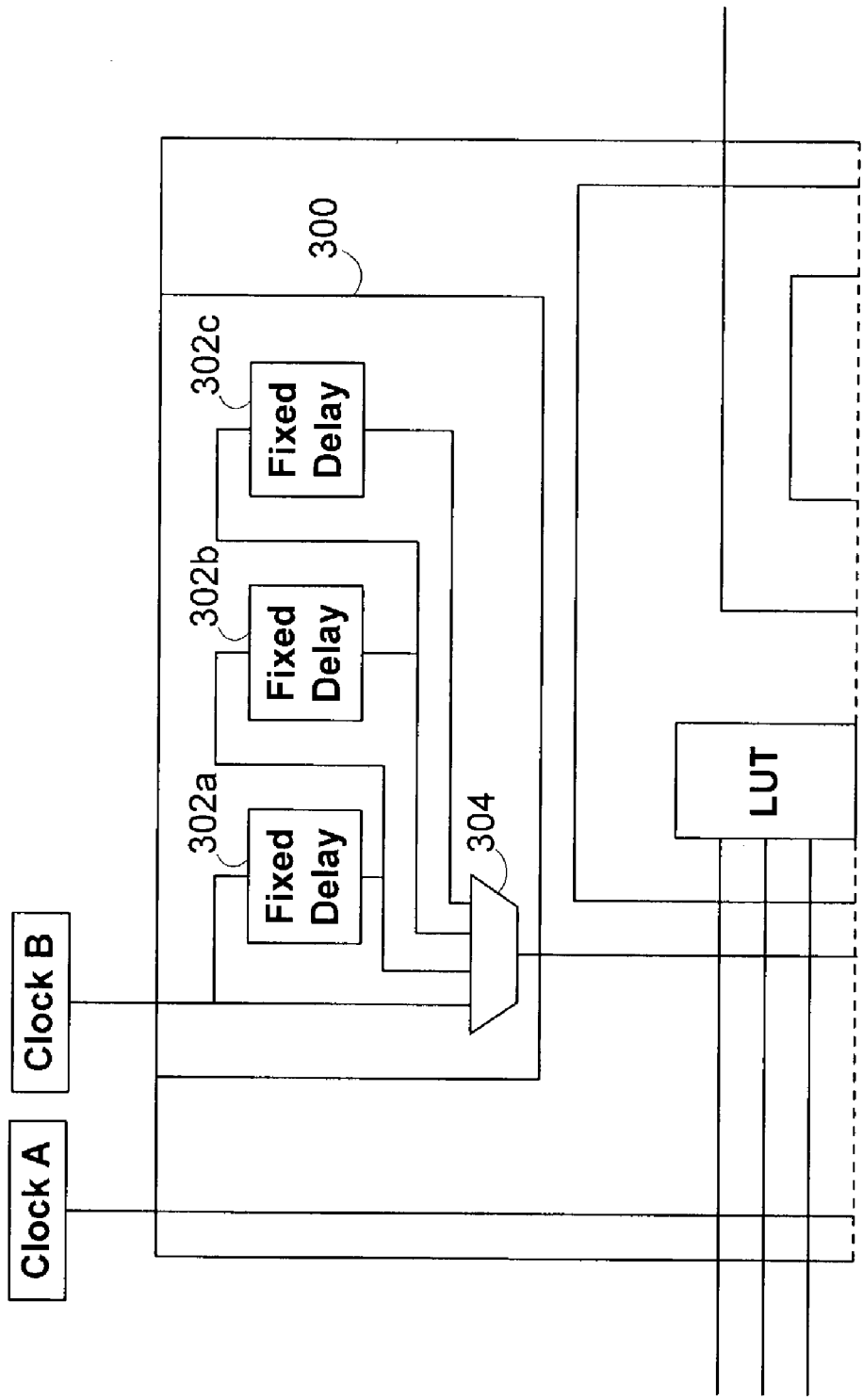
FIG. 3b illustrates a configuration of the local delay circuitry of FIG. 3a in which the path of a clock signal optionally passes through one or more delay elements, in accordance with the invention.

Local delay circuitry 300 may have any suitable circuit configuration including, for example, conventional fixed or programmable electronic delay elements. The circuit configuration may be designed to generate values of delay times in a range that may be useful for clock-shifting optimization (e.g., fractions of the nominal clock period or cycle time). FIG. 3b shows, for example, a circuit configuration in which the path of clock signal B optionally passes through one or more delay elements. The delay elements may be any suitable passive or active device elements, which can be integrated into the PLD architecture. FIG. 3b shows, for example, fixed delay elements 302a, 302b, and 302c, any one of which may be placed in the path of clock signal B by programmable multiplexer 304. Fixed delay elements 302a, 302b, and 302c may, for example, be conductors or wires having suitably tailored physical properties (e.g., length and capacitance) that cause clock signals propagating through them to be delayed, for example, by times t1, t2, and t3, respectively. In circuitry 300 operation, multiplexer 304 may be programmed to pass through either clock signal B, or a version of clock signal B that is delayed by time t1, t2, or t3.

In addition or as an alternative to specifically-provided global or local phase-shifting circuitry, conventional PLD device elements and interconnections may be used (for generating phase-shifted clock signals. This use of conventional device elements and interconnections may be practical in PLD architectures where at least some clock distribution lines and data signal lines are physically interchangeable, and can be electrically linked or connected. For such PLD architectures, the nominal clock signals may, for example, be routed to device element (e.g., flip-flop) inputs over data signal lines or interconnections. Transit time delays through a suitable number of device elements and interconnections in the data signal lines may result in desirable phase-shifted clock signals. These phase-shifted clock-signals may then be rerouted from the data signal lines to appropriate device element clock inputs via the clock lines.

In practice, CAD circuit design tools may be provided with suitable routing algorithms to route the nominal PLD clock signals through an appropriate number of device elements and/or through interconnections that are not used in the initial pre-optimization circuit netlist. The routing algorithms may be similar to conventional circuit design algorithms that are used to route data signals, but which have been modified to be applicable to clock signals. The routing algorithms may include substantially accurate models for delay times through the device elements and interconnections. The amount of delay introduced in the phase-shifted clock signals may be controlled by selecting the number and type of device elements and interconnections placed in the path of the nominal clock signals.

Thus, PLD circuit performance may be optimized using clock-shifting techniques by exploiting either conventional circuit elements such as flip-flops and interconnections, or by using specifically provided phase-shifting circuitry. In any case, suitable clock-shifting algorithms may be used to compute and apply a finite set of requisite clock shifts to a pre-optimization PLD circuit design. The clock-shifting algorithms may be incorporated in CAD design tools so that they may be applied automatically after the initial pre-optimization circuit design has been defined (i.e., placed and routed).

Inventive algorithms, which may be used to compute a finite set of clock skews for optimizing circuit performance, are based on integer programming techniques. The algorithms may take into account for uncertainties or inaccuracies inherent in conventional delay models that are used to compute signal delay or transit times through individual flip-flops, interconnects or other PLD components. As a result, a safe range of clock-skew values, which does not endanger or risk circuit functionality, can be generated for circuit performance optimization. The algorithms may be similar to those that are described by Deshanand P. Singh and Steven D. Brown in "Constrained Clock Shifting for Field Programmable Gate Arrays" FPGA 2002, Feb. 24–26, 2002, Monterey, Calif., USA, pp. 121–126, which is hereby incorporated by reference in its entirety herein.

For a PLD circuit with a known number of available clock lines L, the algorithms first determine if there is any viable set of L clock shift values (one for each of the L available clock lines), which raises the maximum operating frequency circuit toward a desired target value (corresponding to a target clock period Cp). If the results of this determination are positive, an iterative search for an optimal set of L clock shift values may be conducted. The algorithms include steps to determine the smallest clock period $C_{p,\ trial\ set}$ that corresponds to a trial set of L clock shift values. The optimal set of clock shift values may be found by varying the clock shift values to minimize the corresponding $C_{p\ trial\ set}$ values.

Figure 4:
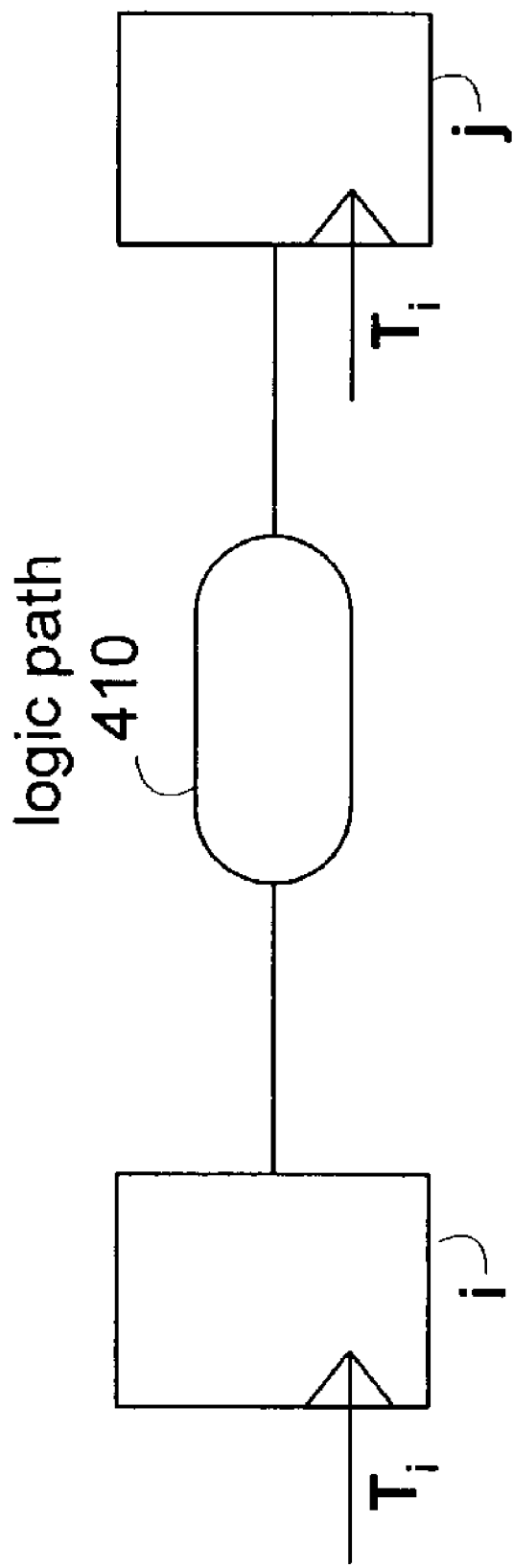
FIG. 4 is a schematic diagram illustrating the time delay along a logic path between two flip-flops.

The algorithms take into account the basic timing constraints on synchronous logic circuit operations. A basic constraint, for example, arises out of the requirement that an input signal should be stable for at least a minimum time (i.e., set-up time $T_s$) prior to the activation of a flip-flop for the signal to be properly registered. Another basic constraint arises out of the requirement that the input signal should be stable for a minimum time (i.e., hold time $T_{hold}$) after the activation of the flip-flop for the signal to be properly registered. These constraints are commonly referred to as zero-clocking and double-clocking constraints, respectively. With reference to FIG. 4, these constraints are described respectively by the mathematical equations:

$$T_i + T_{logic,\ max} + T_s \leq T_j + C_p, \text{ and} \tag{1}$$

$$T_i - T_j \geq T_{logic,\ min}, \tag{2}$$

where, $C_p$ is the clock signal period or cycle time, $T_i$ and $T_j$ are the clock skews at flip-flops i and j, respectively, and $T_{logic,\ max}$ and $T_{logic,\ min}$ are maximum and minimum values of the combinational path delay $T_{logic}$ that may be experienced by a signal propagating along path 410 from flip-flop i to flip-flop j.

The algorithms compute the combinational path delay $T_{logic}$ for specific path 410 using physical models of signal propagation. The models may use nominal parameters to characterize path 410 and to compute a nominal value of $T_{logic} = T_{nominal}$. The characteristic path parameters, in the case of an interconnect conductor may include physical parameters (e.g., capacitance and resistivity), and dimensional parameters (e.g., width, height and thickness). The models also may incorporate circuit parameters such as circuit operating temperature and supply voltage. In the case of active logic paths, the characteristic parameters may include device parameters (e.g., transistor drive strengths and parasitic capacitances). Most if not all of these parameters are subject to fabrication process and operating condition variations. These variations may cause $T_{logic}$ to deviate from its nominal value $T_{nominal}$, and take on an actual value $T_{path}$ in the range $T_{logic,\ min}$ to $T_{logic,\ max}$.

Figure 5:
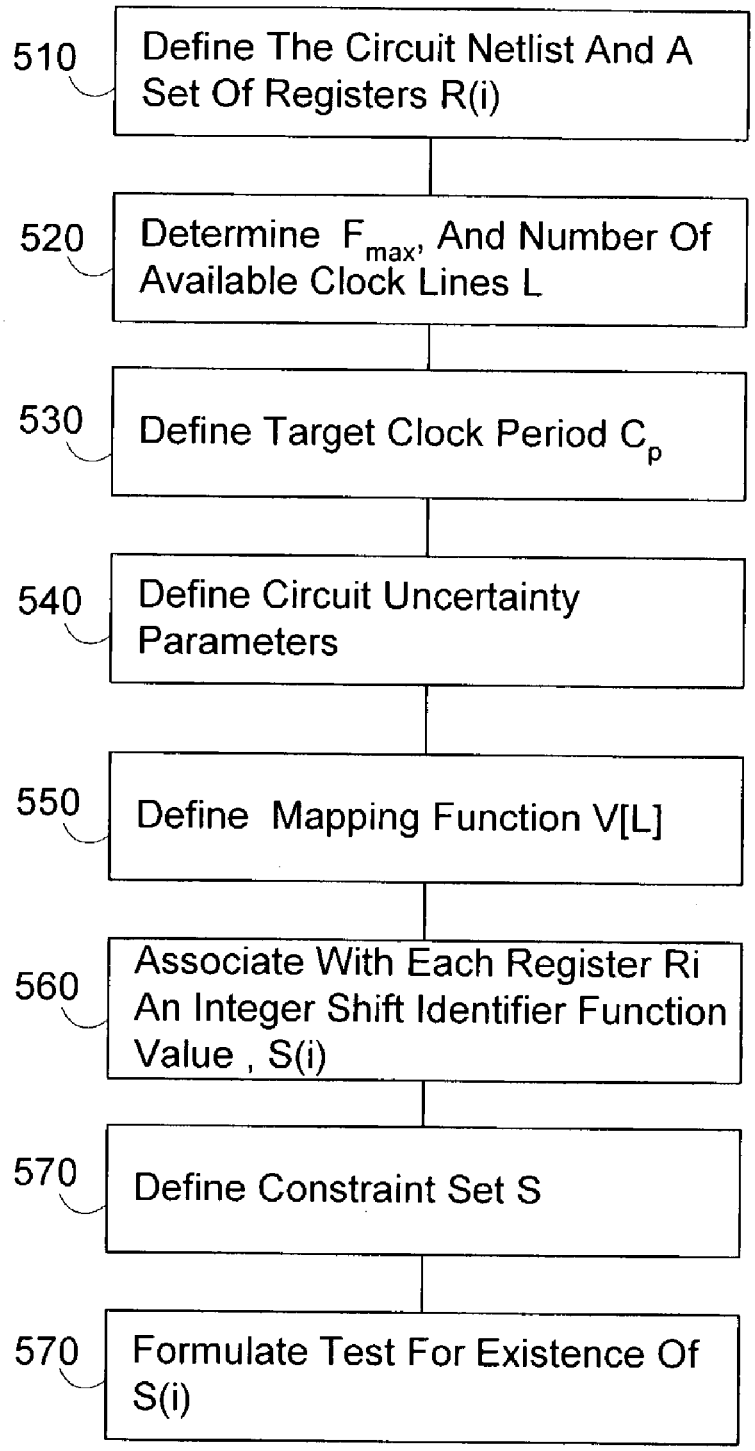
FIG. 5 is a flow diagram illustrating an algorithm, which may be used to obtain a mathematical formulation of the existential question of whether any set of clock shifts improves the maximum operating frequency of a particular PLD circuit, in accordance with the principles of the invention.

FIG. 5 shows illustrative algorithm 500 that may, for example, be used in customizing and mathematically formulating the problem of determining whether a viable set of clock shifts, which improves the maximum operating frequency of a particular PLD circuit, exists. FIG. 5 algorithm 500 (is listed as a particular sequence of steps. (Other algorithms herein i.e., FIG. 6 algorithm 600 and FIG. 7 algorithm 700, are similarly listed). It will be understood that the particular sequences listed herein are only illustrative. In practice, the listed steps may be carried out in any suitable order, merged, modified, or omitted, and other unlisted steps may be incorporated in the algorithms, as appropriate, in accordance with the invention.

With reference to FIG. 5, at step 510, the particular PLD circuit is defined by a circuit netlist, which describes the placement and routing of each circuit device element (e.g., flip-flops or registers R) and each circuit interconnection between the device elements. Further, a set of circuit registers R(i), which are under consideration, is defined. Next, at step 520, circuit parameters, for example, the maximum operating frequency $F_{max}$, may be calculated, and PLD parameters such as the number of available global clock lines L may be determined.

A target clock period Cp that corresponds to a desired operating frequency greater than $F_{max}$ may be defined at step 530. Next, at step 540, circuit element timing uncertainty parameters may be entered in algorithm 500. The entered uncertainty parameters may be based on models that account for PLD component variations, which cause the actual value ($T_{path}$) of transit time $T_{logic}$ along a logic path to differ from its nominal value $T_{nominal}$. In one embodiment, the inventive algorithms use a lumped uncertainty model to account for the range of possible actual values that $T_{logic}$ may take. In the lumped model, timing uncertainty may be quantified by a single parameter U, where U is defined as 1−p/q, and p and q are the normalized ratios $T_{logic,\ min}/T_{path}$, and $T_{path}/T_{logic,\ max}$, respectively. Values of parameters p and q used in the algorithm may be obtained, for example, by empirical estimation. Alternatively, the values of p and q that are commonly reported by PLD manufacturers may be used.

At step 550, a L-dimensional linear array (e.g., V[0] . . . V [L−1]) may be set up to hold clock shift values or skews associated with each of the L clock lines. The array V represents a mapping function from the set of integers, for example, [0, L−1], to the set of positive real numbers. A trial set of clock shift values may, for example, correspond to a set of phase-shifted clock signals obtained using phase-shifting circuitry provided in the programmable logic device (e.g., circuit 200 FIG. 2a).

At step 560, every register Ri in the set R(i) under consideration is associated with one of the L available clock lines. For this purpose, an integer shift identifier or mapping function s(i), which can take integer values that correspond to one of the L clock lines, is defined. By limiting the range of mapping function s(i) to the number of clock lines, each register Ri in the set R(i) is assigned one of the phase-shift values in the array V defined at step 550. In particular register Ri is assigned the phase shift value V[s(i)] associated with clock line s(i).

At step 570, a set of basic constraints (S) on the operation of the PLD circuit (step 510) is defined. For example, the set may include zero-clocking and double clocking constraints. The elements of set S may be formulated as constraints C(i, j, $K_{ij}$), for each interconnection path between pairs of adjacent registers $R_i$ and $R_j$ in the subject circuit netlist. The elements C(i, j, $K_{ij}$) may be defined in terms of Cp, p, q, and V[s(i)]. The term $K_{ij}$ may, for example, be an algebraic function of the variables Cp, p, q, V[s(i)].

Finally at step 580, the problem of determining whether a viable set of clock shifts, which improves the maximum operating frequency of the particular PLD circuit, exists, is formulated as mathematical test for the existence of a mapping function s(i), which maps each register Ri to the set of integers (e.g., [0, L−1]), subject to the constraint set S (step 570).

Figure 6:
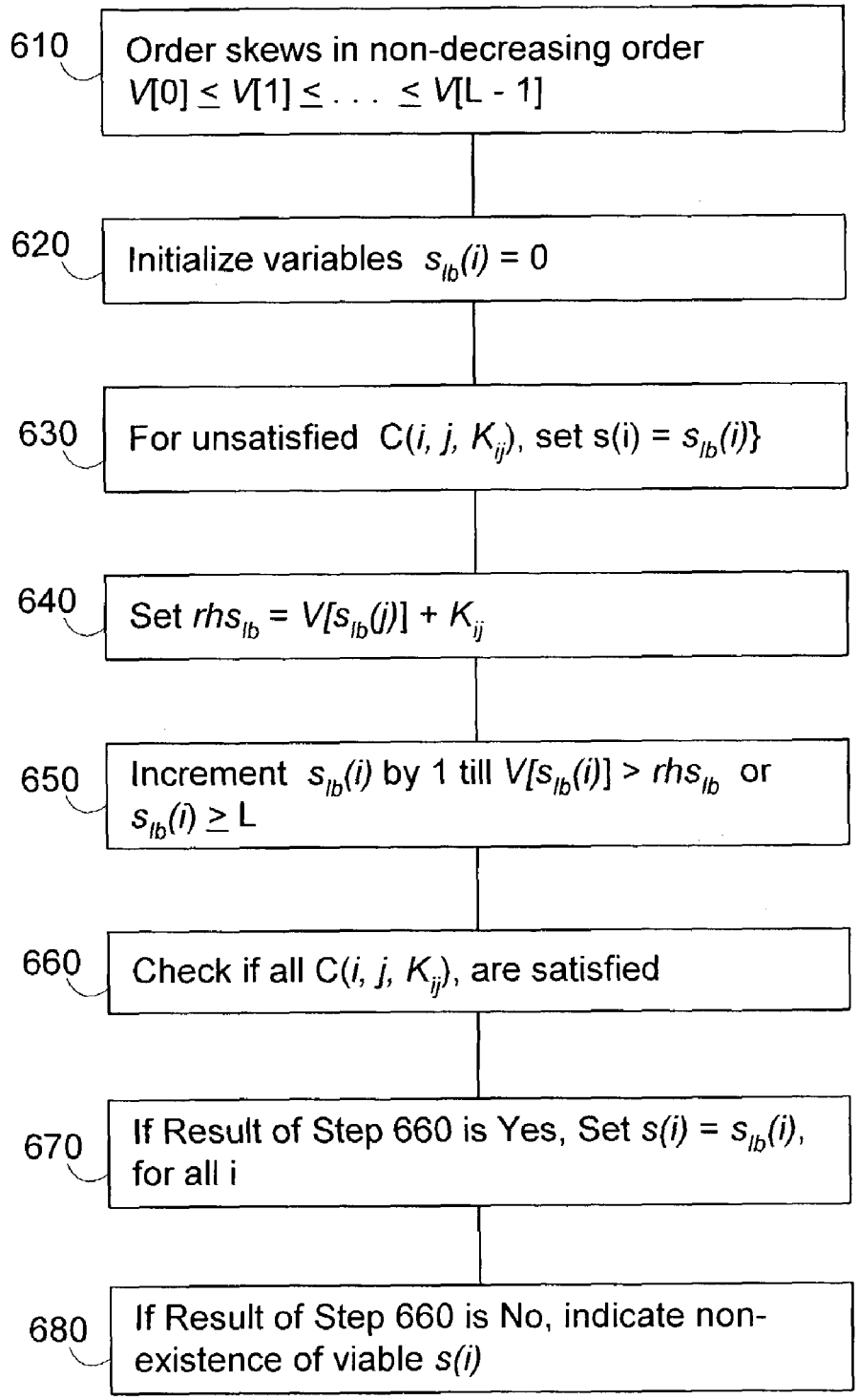
FIG. 6 is a flow diagram of a numerical algorithm, which may be used to prove or disprove the existence of a mapping function from a set of registers to a set of phase shifts, in accordance with the principles of the invention.

The existence of mapping function s(i) may be verified using suitable analytic or numerical procedures. FIG. 6 shows a flow diagram of an illustrative numerical algorithm 600, which may be used to prove or disprove the existence of a mapping function s(i) for a particular PLD circuit. Algorithm 600 may use an iterative relaxation techniques based on integer programming. Algorithm 600 exploits the fact that the constraint set S elements C(i, j, $K_{ij}$) have the general form V[s(i)]≧V[s(j)]+$K_{ij}$. At step 610 of the algorithm 600, phase-shifts or skews V[0] . . . V [L−1] are first organized in an increasing or non-decreasing order (e.g., V[0]≦V[1] . . . ≦V [L−1]). Next at step 620, integer variables $s_{lb}(i)$, are initialized to the lowest element of the set of integers. For example, for the set of integers [0, L−1] all $s_{lb}(i)$ may be set equal to zero.

Then for each register Ri (indexed by integer i), algorithm 600 proceeds iteratively through steps 630, 640 and 650. At step 630, for all constraint set S elements C(i, j, $K_{ij}$) that are unsatisfied, s(i) is set equal to the current value of $s_{lb}(i)$. At step 640, the right-hand sides $rhs_{lb}$ of the constraint set S elements C(i, j, $K_{ij}$) are set equal to V[$s_{lb}(j)$]+$K_{ij}$. Next at step 650, $s_{lb}(i)$ is incremented by 1, until either $rhs_{lb}$ is less than the phase-shift value V[$s_{lb}(i)$] or $s_{lb}(i)$ is greater than the integer L−1. If at step 650 $rhs_{lb}$ is greater than the phase-shift value V[$s_{lb}(i)$], the value $s_{lb}(i)$ corresponding to Ri is left unchanged.

After steps 630 to 650 have been processed, at step 660 a determination is made if all elements of the constraint set S are satisfied.

If the results of step 660 are positive, then at step 670 algorithm 600 indicates the existence of a mapping function s(i), with s(i) set equal to largest incremented value $s_{lb}(i)$ (step 650). If the results of step 660 are negative, then at step 680 algorithm 600 indicates the non-existence of a mapping function s(i). A description of the mathematical theory or basis of step 680 may be found, for example, in Deshanand P. Singh and Steven D. Brown, "Constrained Clock Shifting for Field Programmable Gate Arrays," incorporated by reference herein.

Figure 7:
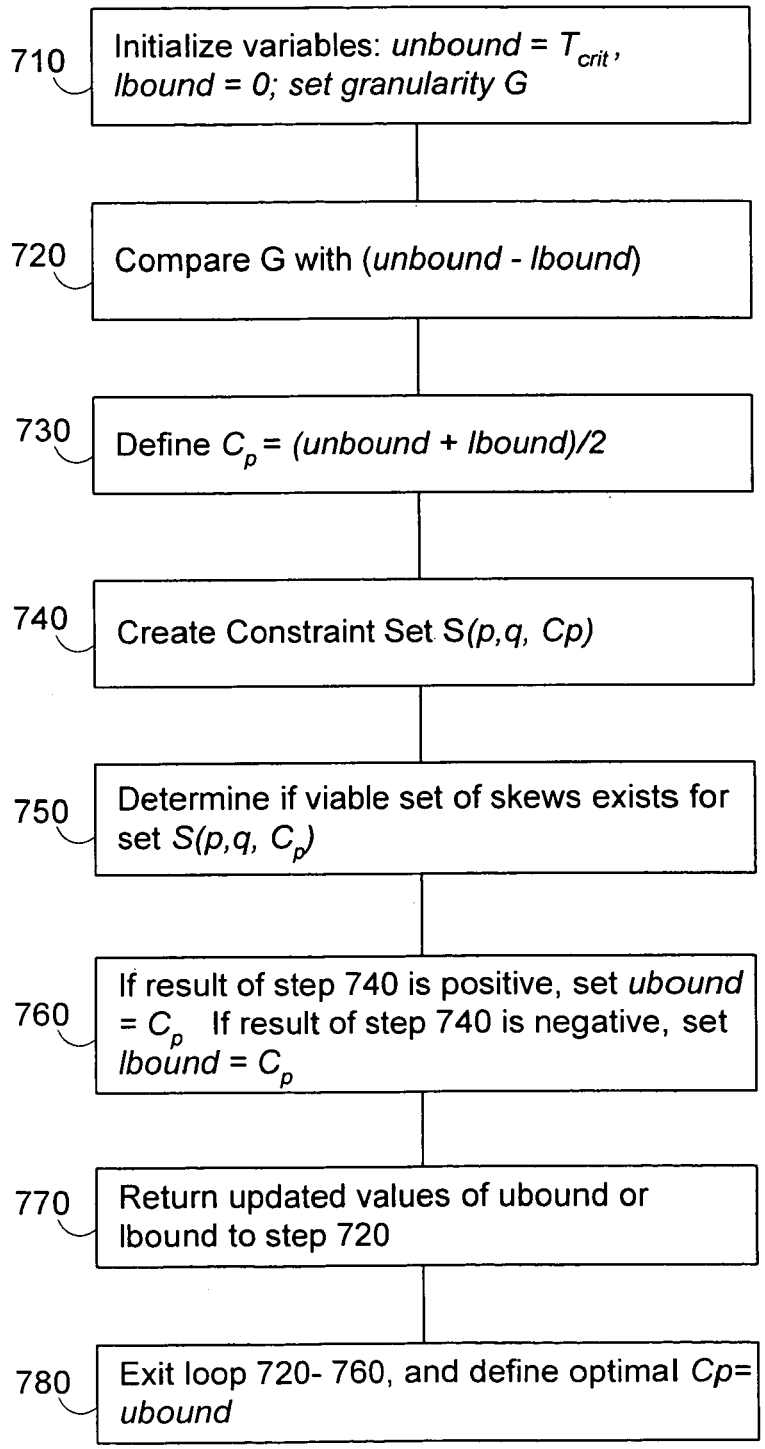
FIG. 7 is a flow diagram of a search algorithm, which may be used to find a set of optimal clock shift values for improving the performance of a PLD circuit, in accordance with the principles of the invention.

Once the existence of a viable set of clock shifts, which improves the maximum operating frequency of a particular PLD circuit, has been demonstrated, for example, by using algorithm 600, other suitable algorithms may be used to find an optimal set of clock shift values. FIG. 7 shows an illustrative search algorithm 700, which may be used in conjunction with algorithms 500 and 600 to optimize the set of clock shift values for a particular PLD circuit.

Algorithm 700 uses a binary search procedure to investigate and determine the optimal or best possible clock period Cp for a particular PLD circuit. The search may be conducted over a finite set of trial Cp values, which are smaller or lower than the pre-optimization circuit critical path length $T_{critical}$. The trial Cp values may, for example, be selected from the range of times extending from $T_{critical}$ down to 0. The range of trial Cp values under investigation is progressively narrowed to identify the best or optimal Cp value.

The best or optimal Cp value may be identified to within the granularity G (minimum difference between adjacent values) of the set of trial Cp values investigated. The value of G may be pre-defined or an user-selectable variable. An user may select a suitable value of G by taking into consideration factors such as the availability of computational resources. In practice a G value of $\frac{1}{32}$ of the nominal clock signal period may be more than adequate for most PLD circuits.

Algorithm 700 search procedure may be further understood with reference to FIG. 7. At step 710 of algorithm 700, lower and upper bounds of the investigated range of Cp values are defined by the variables, ubound and lbound, respectively. These variables may be initialized, for example, to 0 and $T_{critical}$, respectively. Also, granularity variable G may be set equal to a pre-defined or an user-defined value.

At step 720, granularity G is compared with the difference between ubound and lbound. If G is larger than the difference, algorithm 700 bypasses steps 730, 740, 750, 760 and 770 and proceeds to step 780. If G is not larger than the difference, steps 720, 730, 740, 750, 760 and 770 are performed iteratively in a loop. The iterative loop continues as long as the set granularity G is less than the difference between ubound and lbound.

In the iterative loop at step 730, a trial Cp value is defined by the average of ubound and lbound. At step 740, a constraint set S is created. The elements of set S may include the restrictions on device timing arising from setup and hold time requirements and the timing uncertainty due to component variations. The lumped timing uncertainty model described above with reference to algorithm 500 (FIG. 5) may, for example, be used to model component variations. Values of the lumped uncertainty model parameters p and q specific to the subject PLD circuit may be obtained as described above with reference to algorithm 500. The trial Cp value defined at step 730 is used as the Cp value at step 740. The process of creating a constraint set S from variables p, q, and Cp may be identical or similar to algorithm 500 steps 560 and 570 (FIG. 5). At step 750, a determination is made of whether a viable set of performance-improving clock skews exists for the trial value of Cp. Algorithm 600 (FIG. 6) may, for example, be used for this purpose. Algorithm 600, as described with reference to FIG. 6, also determines the clock shift values in the viable set if it exists.

If the result of step 750 is positive, at step 760 ubound is updated or reset to equal the trial value of Cp (step 730). Alternatively, if the result of step 750 is negative, at step 760 lbound is updated or reset to equal the trial value of Cp. At the final loop step 770, the values of ubound and lbound (one of which has been updated at step 760) are returned to the first loop step 720.

After exiting the iterative loop steps 720–770, algorithm 700 proceeds to step 780. At step 780, algorithm 700 returns the current value of ubound as the optimal clock period. The set of clock skew values corresponding to this optimal clock period may have been determined at step 750 using, for example, using algorithm 600. The optimal or best clock skew values are identified by the shift identifier function s(i), all integer values of which do not exceed the number of available clock lines (i.e. are in range [0, L−1]).

The set of optimal clock skew values determined using algorithm 700 or algorithm 600 may be introduced in the subject PLD circuit using any suitable methods including, for example, the methods described herein with reference to FIGS. 2a and 3a.

In accordance with the present invention, software (i.e., instructions) for implementing the aforementioned algorithms may be provided on computer-readable media. It will be appreciated that each of the algorithmic steps (described above in accordance with the invention), and any combination of these steps, can be implemented by computer program instructions. These computer program instructions can be loaded onto a computer or other programmable apparatus to produce a machine, such that the instructions which execute on the computer or other programmable apparatus create means for implementing the functions specified in the flowchart block or blocks. These computer program instructions can also be stored in a computer-readable memory that can direct a computer or other programmable apparatus to function in a particular manner, such that the instructions stored in the computer-readable memory produce an article of manufacture including instruction means which implement the function specified in the flowchart block or blocks. The computer program instructions can also be loaded onto a computer or other programmable apparatus to cause a series of operational steps to be performed on the computer or other programmable apparatus to produce a computer implemented process such that the instructions which execute on the computer or other programmable apparatus provide steps for implementing the functions specified in the flowchart block or blocks.

It will be understood that the foregoing is only illustrative of the principles of the invention, and that various modifications can be made by those skilled in the art without departing from the scope and spirit of the invention.

What is claimed is:

1. A programmable logic device comprising:
   a plurality of device elements for performing logic functions, wherein said device elements include a first device element timed using a first clock signal and operative to produce a first data signal, and a second device element timed using a second clock signal and operative to receive the first data signal;
   programmable interconnection resources for selectively linking said plurality of device elements;
   a clock distribution network for delivering said first and second clock signals to said first and second device elements; and
   phase-shifting circuitry for introducing skew in said clock signals such that said second clock signal is delayed with respect to said first clock signal.

2. The programmable logic device of claim 1, wherein said plurality of device elements are organized in blocks, and said phase-shifting circuitry comprises a delay element disposed about a boundary of one of said blocks.

3. The programmable logic device of claim 1, wherein said phase-shifting circuitry for introducing skew in said clock signals comprises a phase-lock loop frequency synthesizer.

4. The programmable logic device defined in claim 3 wherein said phase-shifting circuitry further comprises a shift register that is clocked by a signal generated by said frequency synthesizer.

5. The programmable logic device defined in claim 4 further comprising sampling taps connected to said shift register and a multiplexer for selecting a set of phase-shifted signals collected on said sampling taps.

6. The programmable logic device defined in claim 5 wherein an output of said multiplexer is connected to said clock distribution network.

7. The programmable logic device defined in claim 1 wherein said phase-shifting circuitry is user-programmable.

8. The programmable logic device defined in claim 7 wherein said programmable interconnection resources are programmed to synthesize a circuit.

9. The programmable logic device defined in claim 8 wherein said circuit is operable in a skewed-clock mode.

10. A programmable logic device comprising:
   a plurality of device elements for performing logic functions, wherein said device elements are timed using clock signals;
   programmable interconnection resources for selectively linking said plurality of device elements, wherein said programmable interconnection resources are programmed to synthesize a circuit;
   a clock distribution network for delivering said clock signals to said plurality of device elements;
   phase-shifting circuitry for introducing skew in said clock signals, wherein said phase-shifting circuitry is user-programmable; and
   wherein a design of said circuit is analyzed to generate a set of performance-improving clock skews.

11. The programmable logic device defined in claim 10 wherein said set of performance-improving clock skews is generated using integer programming.

12. The programmable logic device defined in claim 11 wherein said circuit design and said set of performance-improving clock skews are generated using computer-aided design tools.

13. A method for improving the frequency response of a circuit synthesized in a programmable logic device, wherein said programmable logic device comprises:
   a plurality of device elements for performing logic functions, wherein said device elements include a first device element timed using a first clock signal and operative to produce a first data signal, and a second device element timed using a second clock signal and operative to receive the first data signal; and
   programmable interconnection resources for selectively linking said plurality of device elements;
   said method comprising providing phase-shifting circuitry in said programmable logic device for introducing skew in said clock signals such that said second clock signal is delayed with respect to said first clock signal.

14. The method of claim 13 wherein said providing phase-shifting circuitry comprises providing delay elements in the paths of said clock signals at locations proximate to said device elements.

15. The method of claim 13 wherein said providing phase-shifting circuitry comprises providing a phase-lock loop frequency synthesizer.

16. The method of claim 15 wherein providing phase-shifting circuitry further comprises providing a shift register that is clocked by a signal generated by said frequency synthesizer.

17. The method of claim 16 further comprising shifting a clock signal through said shift register, and wherein providing phase-shifting circuitry for introducing skew in said clock signals further comprises:
   providing sampling taps connected to said shift register; and
   providing a multiplexer for selecting a set of phase-shifted signals collected on said sampling taps.

18. The method of claim 17, wherein said programmable logic device further comprises a clock distribution network for delivering said clock signals to said plurality of device elements, and wherein said providing a multiplexer further comprises connecting an output of said multiplexer to said clock distribution network.

19. The method of claim 13 further comprising analyzing a design of said circuit to generate a set of performance-improving clock skews.

20. A method for improving the frequency response of a circuit synthesized in a programmable logic device, wherein said programmable logic device comprises:
   a plurality of device elements for performing logic functions, wherein said device elements are timed using clock signals; and
   programmable interconnection resources for selectively linking said plurality of device elements;
   said method comprising:
      providing phase-shifting circuitry in said programmable logic device for introducing skew in said clock signals to adjust the relative timing of device elements in said circuit; and
      analyzing a design of said circuit to generate a set of performance-improving clock skews, wherein said analyzing said circuit design to generate a set of performance-improving clock skews comprises using integer programming.

21. The method of claim 13 wherein said providing phase-shifting circuitry comprises providing user-programmable phase-shifting circuitry.

22. A method for improving the frequency response of a circuit synthesized in a programmable logic device, wherein said programmable logic device comprises:
   a plurality of device elements for performing logic functions, wherein said device elements are timed using clock signals; and
   programmable interconnection resources for selectively linking said plurality of device elements;
   said method comprising:
      providing phase-shifting circuitry in said programmable logic device for introducing skew in said clock signals to adjust the relative timing of device elements in said circuit, wherein said providing phase-shifting circuitry comprises providing user-programmable phase-shifting circuitry synthesized using computer-aided design tools; and
      using said computer-aided design tools to generate said set of performance-improving clock skews.

23. The method of claim 13 further comprising inserting a set of phase shifts in said clock signals and operating said circuit in a skewed clock mode.

24. A method for improving the frequency response of a circuit synthesized in a programmable logic device, wherein said programmable logic device comprises:
   a plurality of device elements for performing logic functions, wherein said device elements are timed using clock signals; and
   programmable interconnection resources for selectively linking said plurality of device elements, said method comprising:
      determining a clock signal phase-shift value that reduces critical path length;

routing said clock signal through said interconnection resources and said device elements that are not used in said circuit to obtain a clock signal skewed by said phase-shift value; and using said skewed clock signal to adjust the relative timing of device elements in said circuit.

25. A method for improving the performance of a programmable logic device circuit, wherein said programmable logic device comprises:
 a plurality of device elements that are timed using clock signals; and
 programmable interconnection resources for selectively linking said plurality of device elements to form said circuit, said method comprising:
  determining the critical path length of said circuit; and
  adjusting the relative timing of at least one of said plurality of device elements to decrease the critical path length of said circuit.

26. The method of claim 25 wherein said adjusting the relative timing comprises introducing skew in the clock signal that is used to time said at least one device element.

27. The method of claim 25 wherein said adjusting the relative timing comprises analyzing a design of said circuit to determine the feasibility of improving circuit performance by introducing skew in at least one clock signal that is used to time a device element.

28. The method of claim 27 wherein said analyzing a design of said circuit further comprises using an integer programming algorithm that is incorporated in a computer aided design tool.

29. The method of claim 25 wherein said analyzing a design of said circuit further comprises defining a set of timing constraints for the proper functioning of said circuit, wherein said set of timing constraints includes device set-up time and device hold time constraints.

30. The method of claim 29 wherein said defining a set of timing constraints for the proper functioning of said circuit further comprises accounting for variations in components of said circuit.

31. The method of claim 30 wherein accounting for variations in said circuit components comprises using a lumped parameter model to describe a maximum and a minimum signal time delay along a circuit component.

32. The method of claim 29 wherein said analyzing a design of said circuit further comprises determining a clock skew value that does not violate said set of timing constraints.

33. The method of claim 25 wherein said adjusting the relative timing comprises analyzing a design of said circuit to determine a set of clock skews that increases circuit operating frequency toward a target frequency.

34. The method of claim 33 wherein said analyzing a design of said circuit comprises a search for sets of clock skew values corresponding to clock periods lower than the circuit critical path length.

35. The method of claim 34 wherein said search for sets of clock skew values is subject to a set of device operating constraints.

36. The method of claim 33 wherein said analyzing a design of said circuit further comprises using an integer programming algorithm that is incorporated in a computer aided design tool.

* * * * *